US008699293B2

(12) United States Patent
Yan et al.

(10) Patent No.: US 8,699,293 B2
(45) Date of Patent: Apr. 15, 2014

(54) NON-VOLATILE STORAGE SYSTEM WITH DUAL BLOCK PROGRAMMING

(75) Inventors: Tianhong Yan, San Jose, CA (US); Tz-yi Liu, Palo Alto, CA (US); Roy E. Scheuerlein, Cupertino, CA (US)

(73) Assignee: Sandisk 3D LLC, Milpitas, CA (US)

( * ) Notice: Subject to any disclaimer, the term of this patent is extended or adjusted under 35 U.S.C. 154(b) by 214 days.

(21) Appl. No.: 13/095,779

(22) Filed: Apr. 27, 2011

(65) Prior Publication Data

US 2012/0275210 A1    Nov. 1, 2012

(51) Int. Cl.
| | |
|---|---|
| G11C 5/02 | (2006.01) |
| G11C 5/06 | (2006.01) |
| G11C 7/18 | (2006.01) |
| G11C 8/14 | (2006.01) |
| G11C 8/12 | (2006.01) |

(52) U.S. Cl.
USPC ........... 365/230.03; 365/230.06; 365/51; 365/63; 365/72; 365/238.5; 365/230.04; 365/220; 365/189.16

(58) Field of Classification Search
CPC ............ G11C 5/02; G11C 5/025; G11C 5/06; G11C 5/063; G11C 7/18; G11C 8/14; G11C 8/12
USPC .......... 365/148, 189.16, 230.03, 191, 230.06, 365/185.11, 185.13, 230.02, 185.27, 226, 365/163, 185.33, 51, 63, 71, 72, 158, 238.5, 365/230.04, 220
See application file for complete search history.

(56) References Cited

U.S. PATENT DOCUMENTS

| | | |
|---|---|---|
| 5,890,192 A | 3/1999 | Lee |
| 6,735,104 B2 | 5/2004 | Scheuerlein |
| 7,111,140 B2 | 9/2006 | Estakhri |
| 7,142,471 B2 | 11/2006 | Fasoli |

(Continued)

FOREIGN PATENT DOCUMENTS

EP    1282134    2/2003

OTHER PUBLICATIONS

PCT International Search Report dated Oct. 8, 2012, PCT Patent Application PCT/US2012/034674.

(Continued)

*Primary Examiner* — J. H. Hur
(74) *Attorney, Agent, or Firm* — Vierra Magen Marcus LLP

(57) ABSTRACT

A non-volatile storage system is disclosed that includes a plurality of blocks of non-volatile storage elements, a plurality of word lines connected to the blocks of non-volatile storage elements such that each word line is connected to adjacent blocks of non-volatile storage elements, a plurality of bit lines connected to the blocks of non-volatile storage elements, multiple sets of word lines drivers such that each set of word line drivers is positioned between two adjacent blocks for driving word lines connected to the two adjacent blocks, global data lines, local data lines in selective communication with the bit lines, one or more selection circuits that selectively connect the global data lines to selected local data lines and connect unselected local data lines to one or more unselected bit line signals and control circuitry in communication with the one or more selection circuits and the global data lines. The control circuitry concurrently programs non-volatile storage elements of two adjacent blocks by applying programming signals on word lines connected to the two adjacent blocks and applying programming signals on appropriate bit lines via the global data lines and the one or more selection circuits.

20 Claims, 15 Drawing Sheets

(56) References Cited

U.S. PATENT DOCUMENTS

| | | |
|---|---|---|
| 7,424,593 B2 | 9/2008 | Estakhri |
| 7,499,366 B2 | 3/2009 | Scheuerlein |
| 8,004,926 B2 * | 8/2011 | Sutardja et al. .......... 365/230.03 |
| 2004/0188714 A1 | 9/2004 | Scheuerlein |
| 2004/0190360 A1 | 9/2004 | Scheuerlein |
| 2006/0146639 A1 | 7/2006 | Fasoli |
| 2008/0151637 A1 | 6/2008 | Doyle |
| 2009/0161474 A1 | 6/2009 | Scheuerlein |
| 2010/0046267 A1 | 2/2010 | Yan |
| 2010/0265750 A1 | 10/2010 | Yan |

OTHER PUBLICATIONS

PCT Written Opinion of the International Searching Authority dated Oct. 8, 2012, PCT Patent Application PCT/US2012/034674.

* cited by examiner

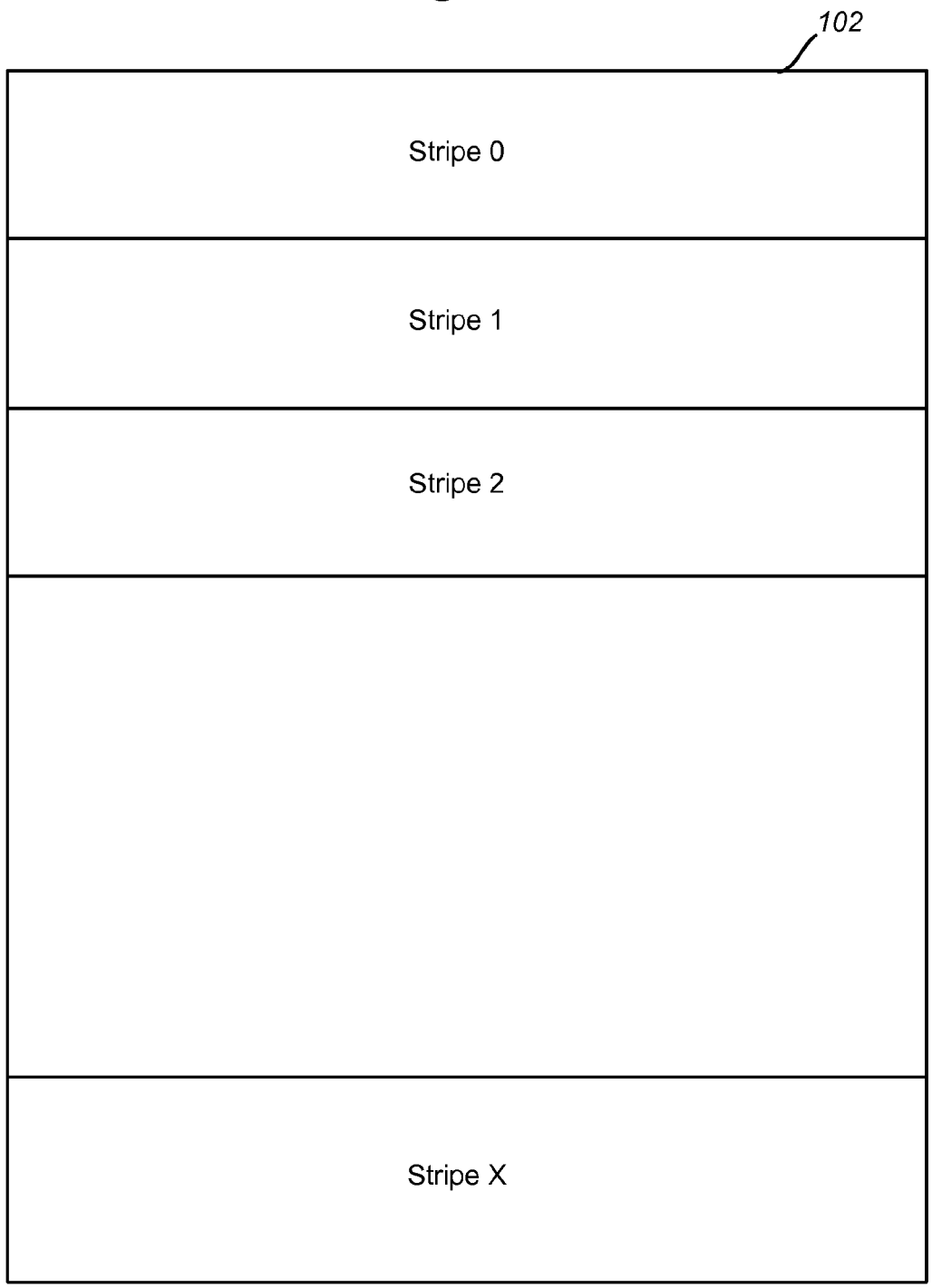

NON-VOLATILE STORAGE SYSTEM WITH DUAL BLOCK PROGRAMMING

BACKGROUND

1. Field

The present invention relates to technology for data storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

BRIEF DESCRIPTION OF THE DRAWINGS

FIG. 6 depicts one example organization of a memory array.

DETAILED DESCRIPTION

A non-volatile storage system is disclosed that reduces the amount of power needed to program data, and allows for more memory cells in the non-volatile storage system to be programmed concurrently. In one example embodiment, the non-volatile storage system includes a plurality of blocks of non-volatile storage elements. In some designs, when a block is selected for programming other adjacent blocks will be partially selected such that some fraction of the adjacent blocks will have memory cells that are reversed biased. Although these reverse biased memory cells in the adjacent blocks will not experience programming such that they will change data states, these memory cells will experience a reverse bias memory cell current. If enough memory cells are reverse biased, then the non-volatile storage system will consume more power than desired. To alleviate this situation, it is proposed that two adjacent blocks that share word line drivers be programmed concurrently. Such a scheme will reduce the number of reverse biased unselected/partially selected memory cells, in comparison to the number of memory cells selected for programming, that contribute to the power consumption of the system. Concurrently programming two adjacent blocks that share word line drivers will also allow more memory cells to be programmed concurrently as the total effective IR drop across all selected memory cells will be less limiting since the word line drivers can be located between the two blocks (e.g., in the middle of the memory cells being programmed). These concepts will be discussed in more detail below.

Figure 1:
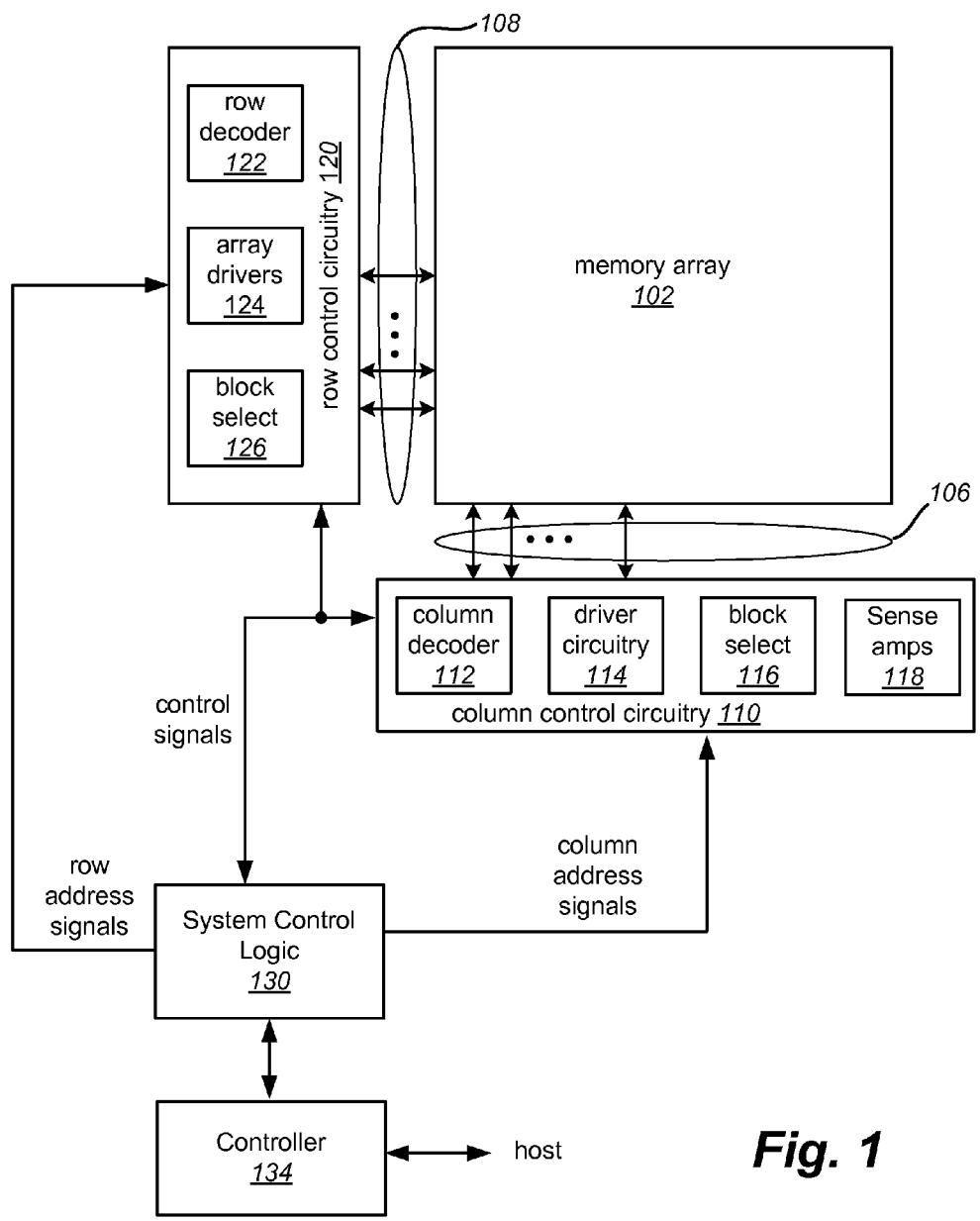
FIG. 1 is a block diagram of one embodiment of a memory system.

FIG. 1 is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller

134. Controller 134 communicates with a host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
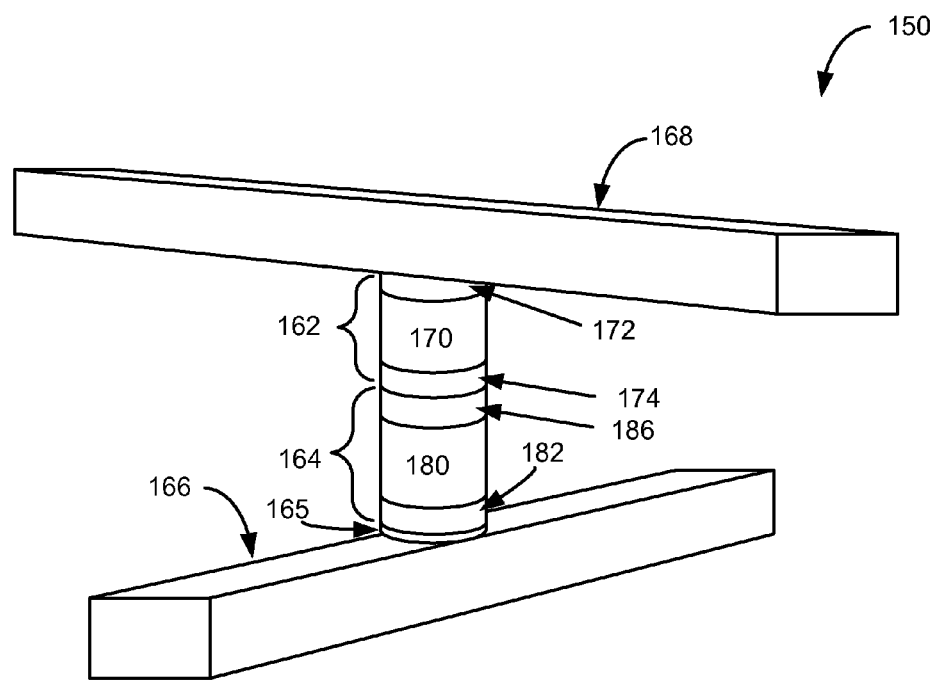
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element using a selective deposition process and then annealed and/or oxidized (if necessary). In other embodiments Hafnium oxide may be deposited by an atomic layer deposition process using a precursor containing Hafnium.

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_{1-X}Ca_XMnO_3$ (PCMO), $La_{1-X}Ca_XMnO_3$ (LCMO), $LaSrMnO_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in United States Patent Application Publication No. 2009/0323391, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
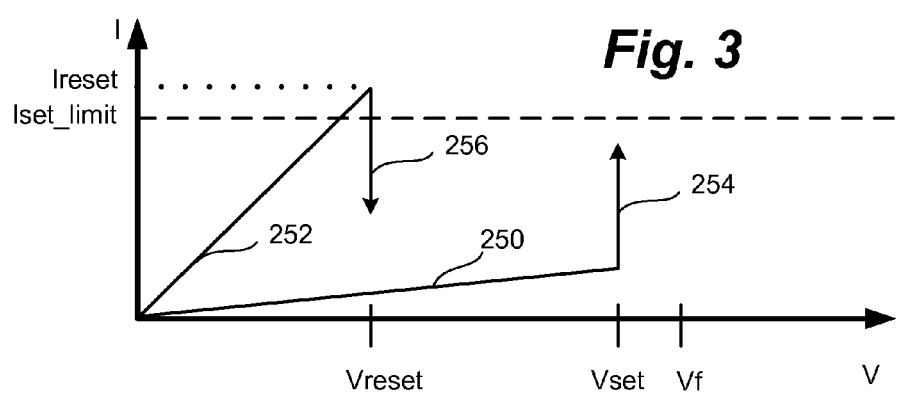
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in United States Patent Application 2009/0323391, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET. One example of this capacitive discharge method can be found in United States Patent Application 2009/0323393, "Capacitive Discharge Method For Writing To Non-Volatile Memory," filed on Dec. 19, 2008, incorporated herein by reference in its entirety.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
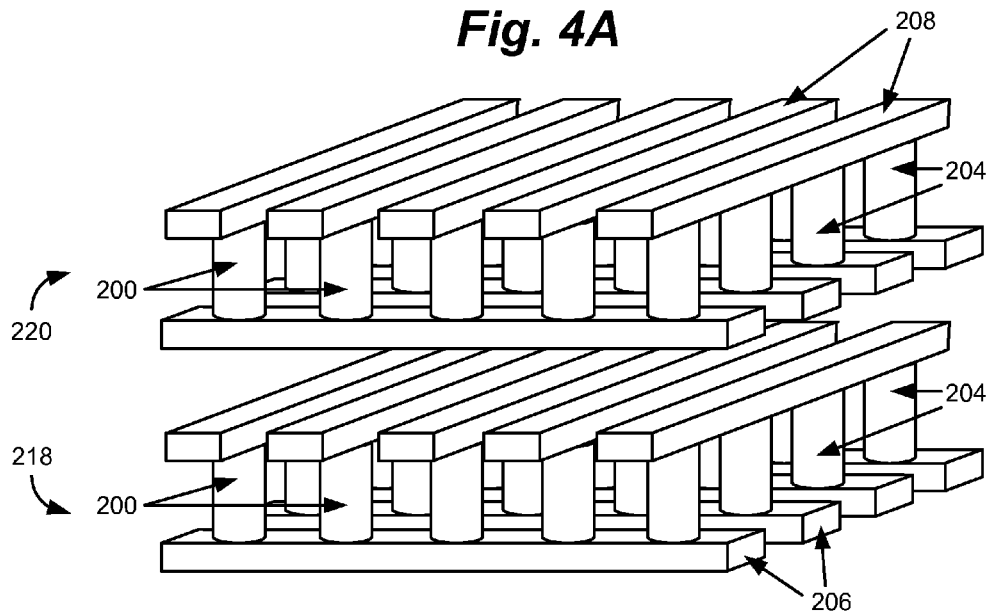
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
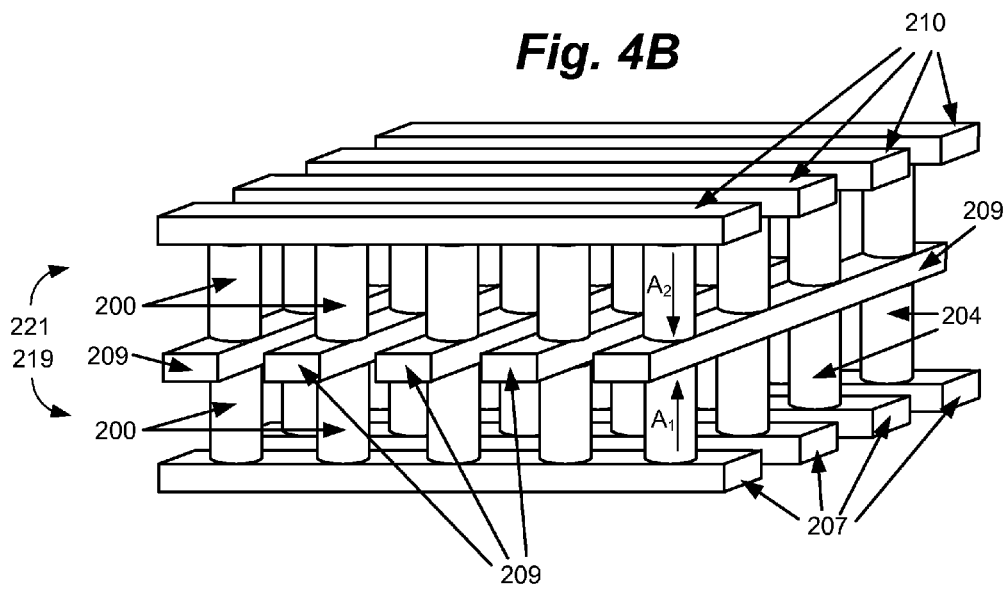
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952, 030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
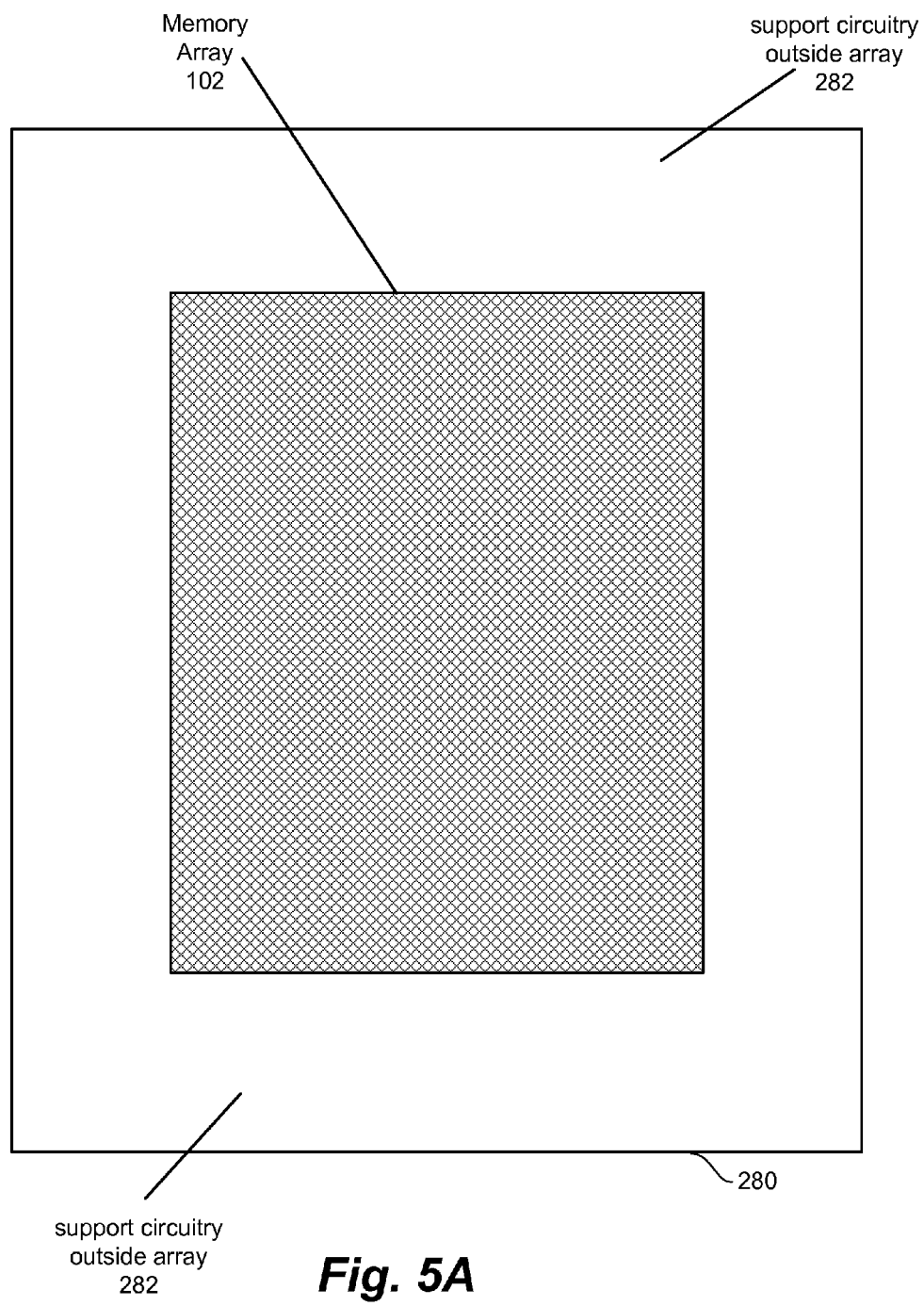
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
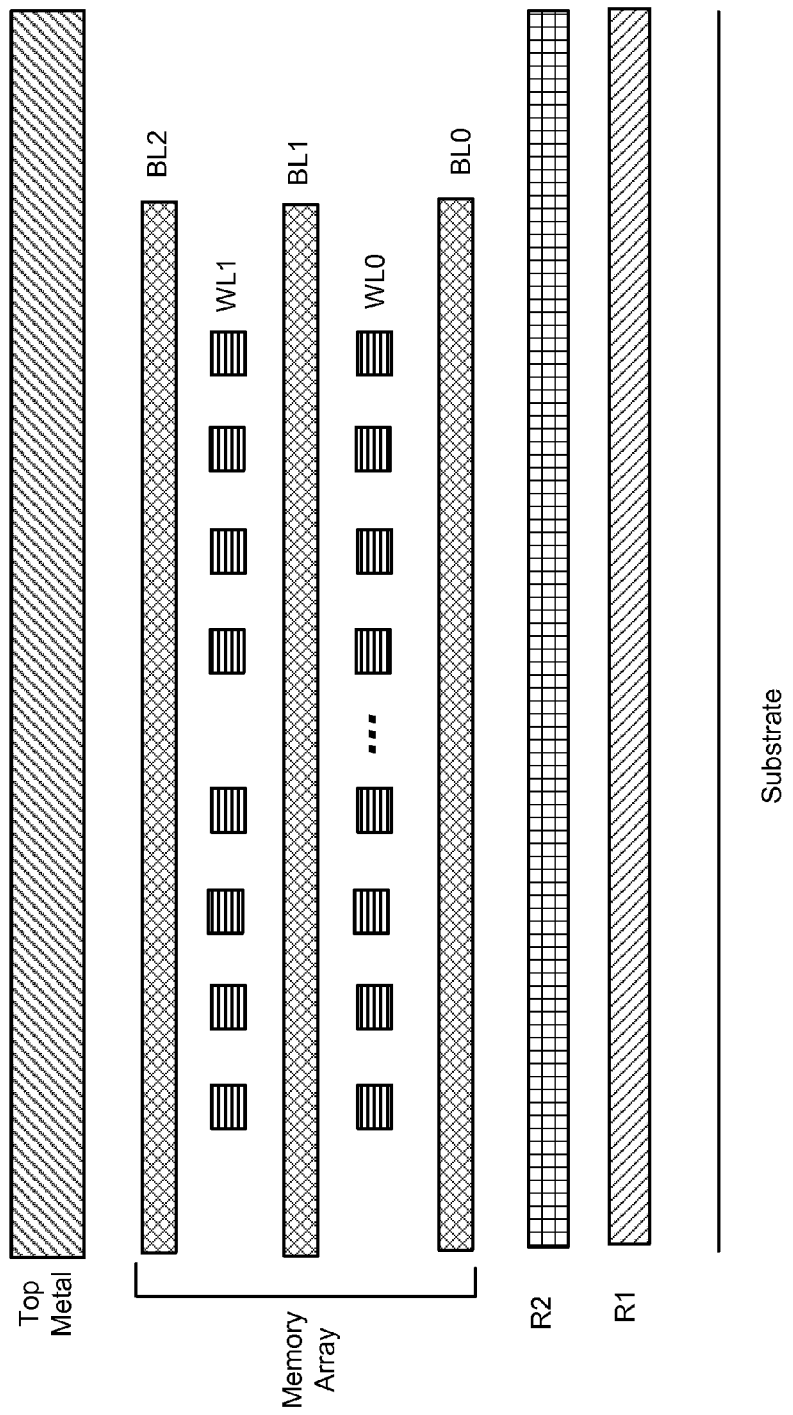
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Memory array 102 is subdivided into stripes, as depicted in FIG. 6. Each stripe is divided into blocks and blocks are grouped into bays. In one embodiment, each block includes two stripes. In other embodiments, one bay can be implemented in one strip or a portion of one stripe. In some implementations, a bay can be implemented across all or portions of two or more stripes. Each bay includes multiple blocks. The number of blocks in a bay can vary.

Figure 7:
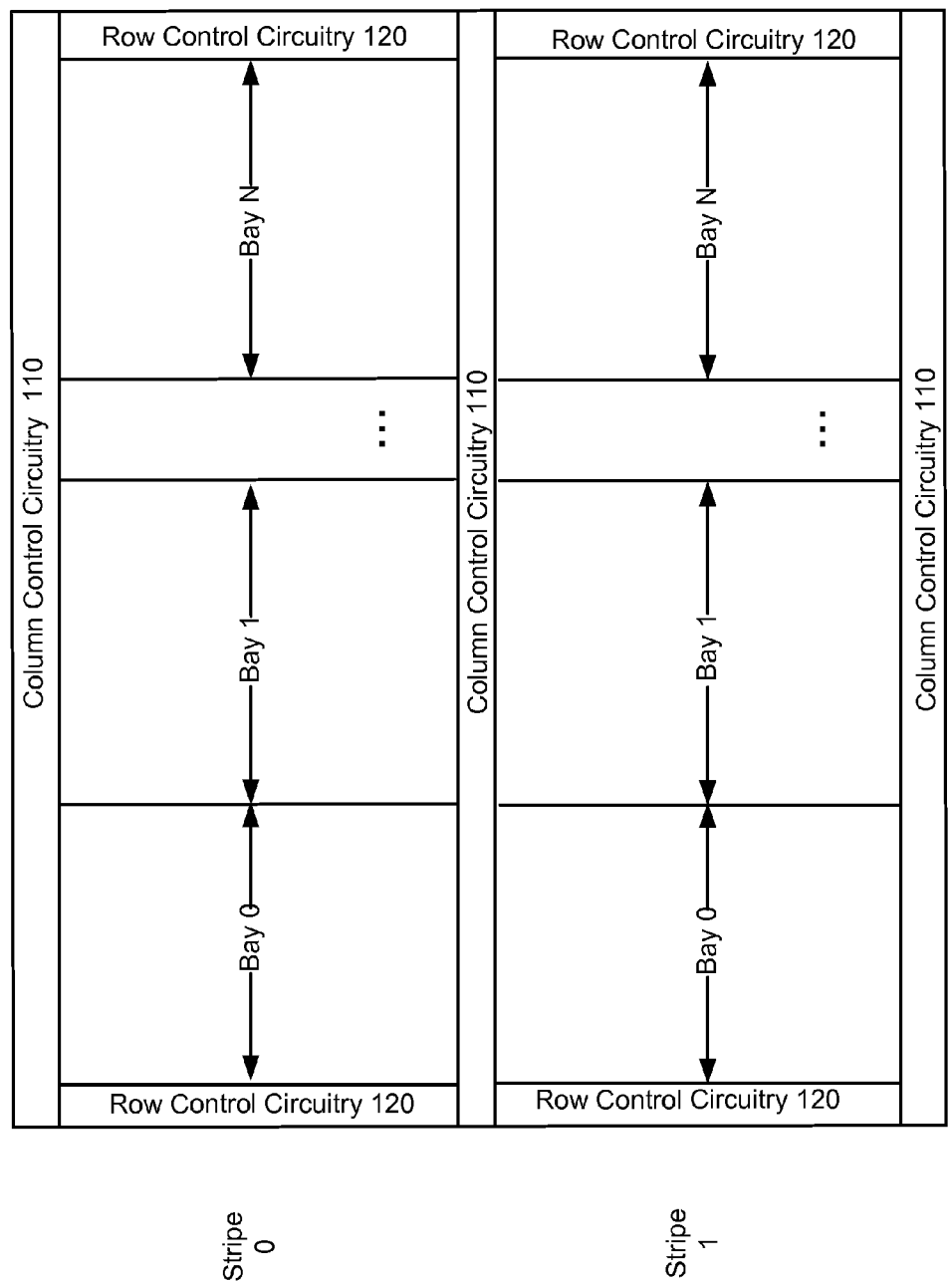
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
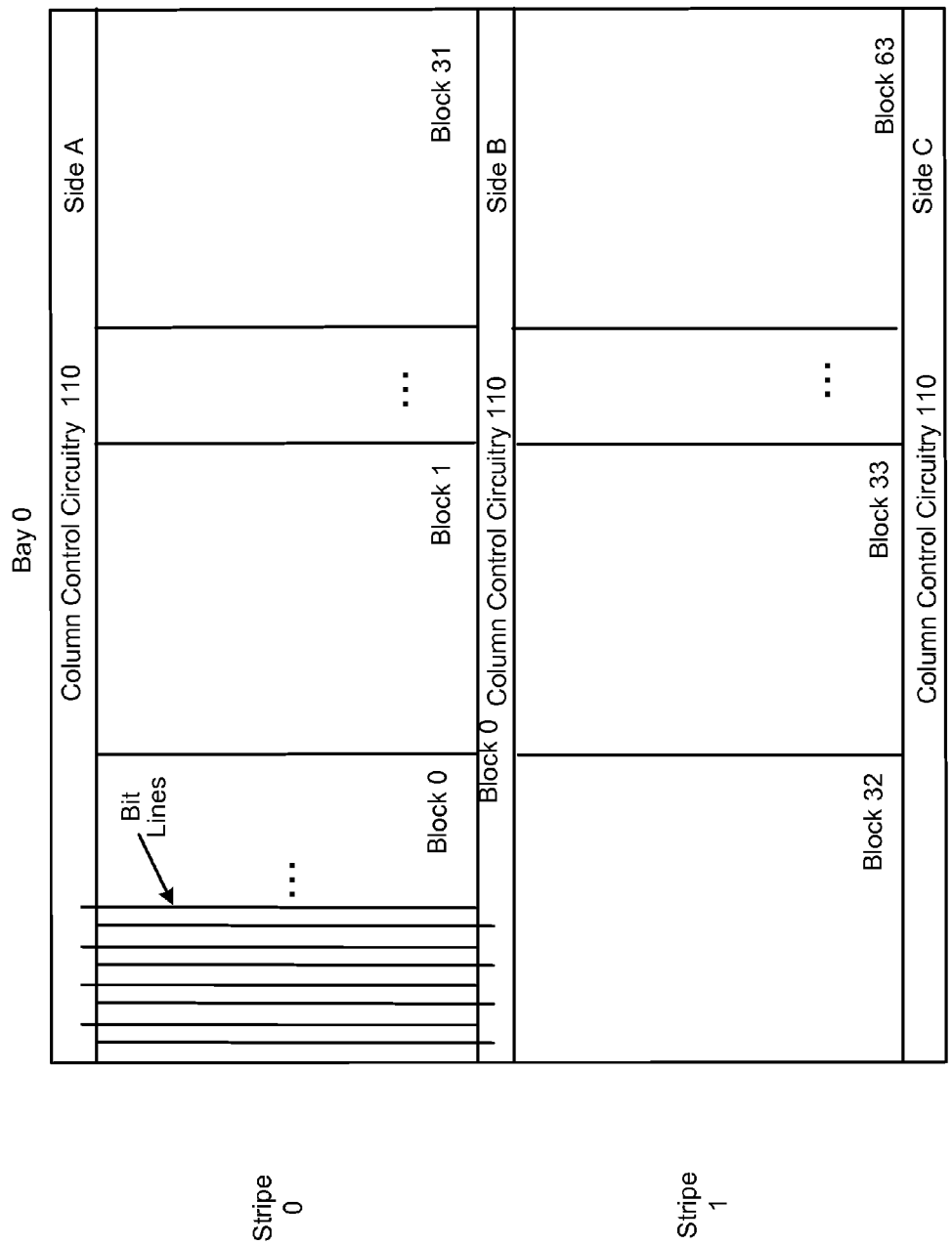
FIG. 8 depicts one embodiment of a bay.

FIG. 8 provides more details of one example bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and driver bit lines for its upper or bottom blocks.

In one set of embodiments, word lines (not depicted in FIG. 8) will be shared by two adjacent blocks. For example, half of the word lines connected to Block 1 will also be connected to Block 0 and the other half of the word lines connected to Block 1 will also be connected to Block 2. In one example implementation, every other word line connected to Block 1 will also be connected to Block 0, with the intervening word lines being also connected to Block 2. For embodiments word lines shared by two adjacent blocks, the word line drivers will be positioned on the substrate and between the two adjacent blocks. For example, a word line connected to Block 0 and Block 1 will be driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

In previous systems, global routing lines for routing signals between the 64 (or less) selected memory cells and the sense amplifiers were implemented in metals layers R1 or R2, which have a relatively large resistance and capacitance. To reduce overall resistance and capacitance, some previous designs have implemented half of the global routing lines for routing signals between the selected memory cells and the sense amplifiers in R1 (or R2) and the other half of the global routing lines for routing signals between the selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
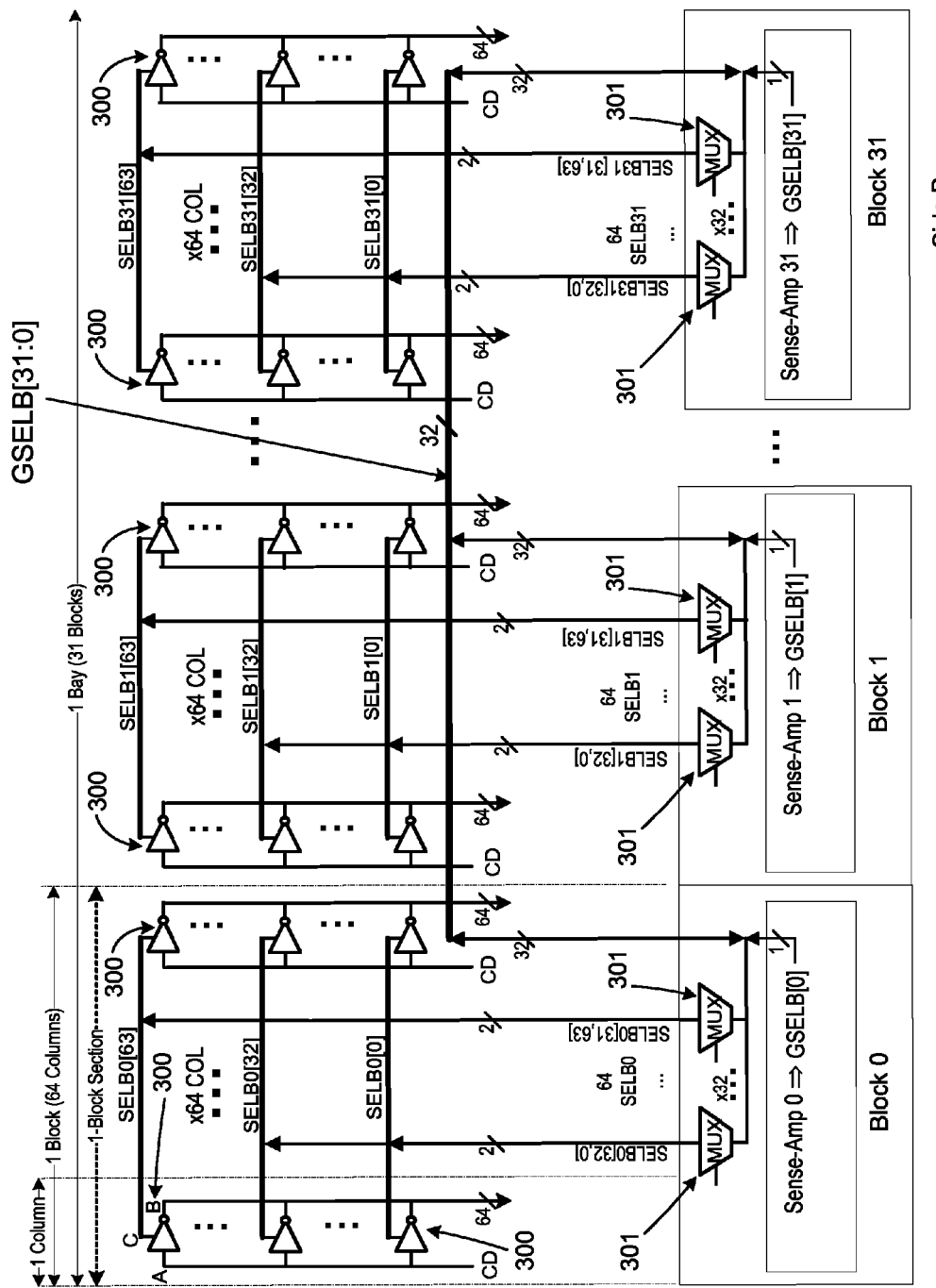
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB1[63:0], block 1 includes SELB1[63:0], . . . block 31 includes SELB31 [63:0]. In one embodiment, the local data lines SELB0[63:0], SELB1[63:0], SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], . . . or SELB31[63:0]). As can be seen from FIG. 9, each of the selection circuits 300 receives a selection signal CD from column decoders 112 and a bit line connection from one of the 64 bit lines associated with the column. In one embodiment, each column will have its own selection signal CD. Based on the selection input from column decoder 112, the selection circuit 300 will connect or disconnect the bit line to a respective one of the local data lines (e.g., SELB0 [63:0], SELB1[63:0], SELB31[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], . . . or SELB31[63:0]). Each block has its own set of thirty two 2:1 multiplexers (e.g., MUX 301) that are associated with the block and located on the substrate below the block. Each set of sixty four local data lines (SELB0[63:0], SELB1[63:0], . . . or SELB31[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[33], . . . the thirty second multiplexer receives SELB0[31] and SELB0 [63]. Each of the multiplexers in a block receives a common selection signal and an enable signal from column decoders 112 so that thirty two of the sixty four local data lines are selected. In one embodiment, the multiplexers include the ability to bias the unselected SELB with the unselected bit line voltage VUB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB [1], etc. The global data lines GSELB[31:0] are implemented in Top Metal and connections between global data lines GSELB[31:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[31:0] are connected to one of the sense amplifiers. For example, the output Sense-Amp0 of the sense amplifier located underneath block 0 is connected to GSELB[0], the output Sense-Amp 1 of the sense amplifier located underneath block 1 is connected to GSELB [1], . . . and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-towell parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
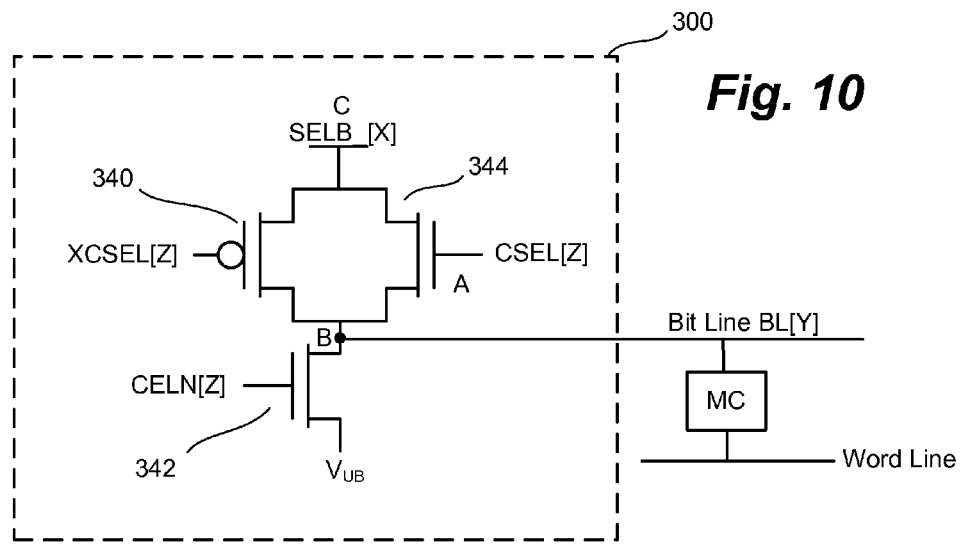
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes p-channel transistor 340 and n-channel transistor 344 both connected to SELB_[X] at node C. Transistor 340 and transistor 344 are also both connected to n-channel transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The gate of transistor 344 is connected to selection signal CSEL[Z] at node A. Note that XCSEL[Z] is an inverted version of CSEL[Z]. The gate of transistor 342 is connected to CELN[Z]. The signals CSEL[Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z]. CSEL[Z] of FIG. 10 is analogous to CD of FIG. 9.

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL[Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB via the n-channel transistor 342. When transistors 340 and 344 are off and CELN[Z] is 0, then transistor 342 is off and the bit line BL[Y] is floating. This condition is useful for the some embodiments of the capacitance discharge method of programming described herein.

Figure 11:
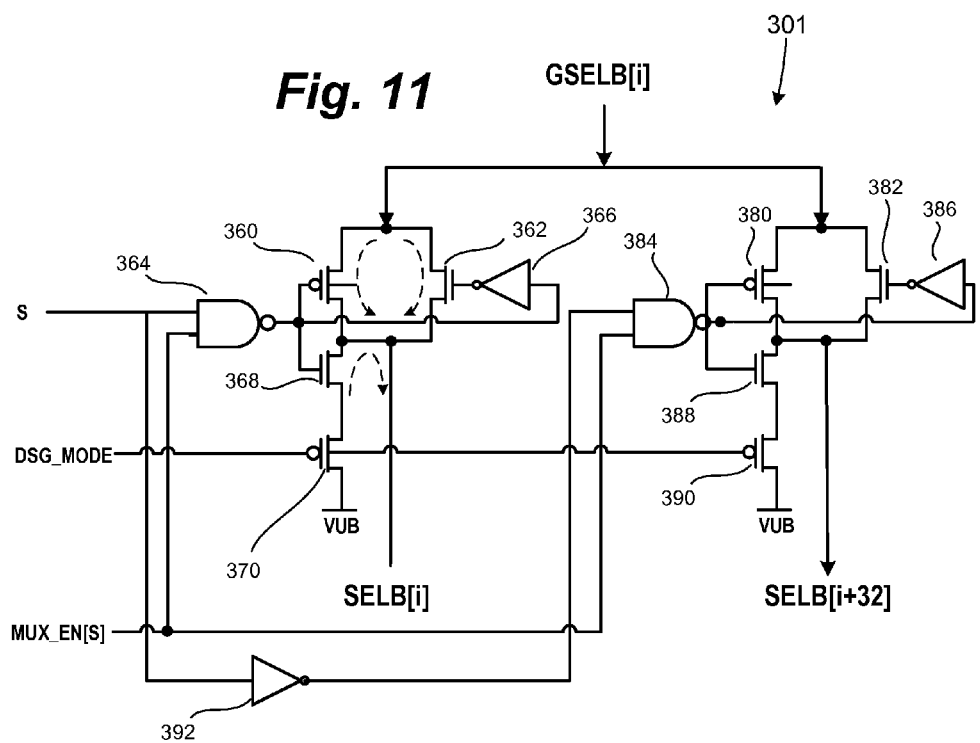
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 1 when performing one of the possible embodiments of the programming operation using the capacitance discharge mode of programming described herein. By setting signal DSG_MODE to 1, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 390 receives the signal DSG_MODE from system control logic 130. When DSG_MODE is set to 0 and SELB[i] is selected, SELB[i+32] receives VUB via p-channel transistor 390 (in some embodiments). When DSG_MODE is set to 0 SELB[i+32] is selected, SELB[i] receives VUB via p-channel transistor 370 (in some embodiments). The signal DSG_MODE is designed for use with the capacitive discharge method described above. When DSG_MODE is set to 1, SELB[i] can be charged up according to the data pattern. The signal MUX_EN[S] is disabled, and the signals SELB[i] and BL[i] are floating. The selected word line goes low and selected memory cells are programmed.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming. In one embodiment, two different MUX_EN[S] signals each connected to half the multiplexors are used to selectably connect half the GSELB bus to half of the local SELB[i] bus. In this case sixteen bit lines can be selected for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers for side B are in communication with thirty two memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, the selected bit lines will also be charged. Once the bit lines are charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection (discussed below) can change so that programming for the next word line will commence.

Figure 12:
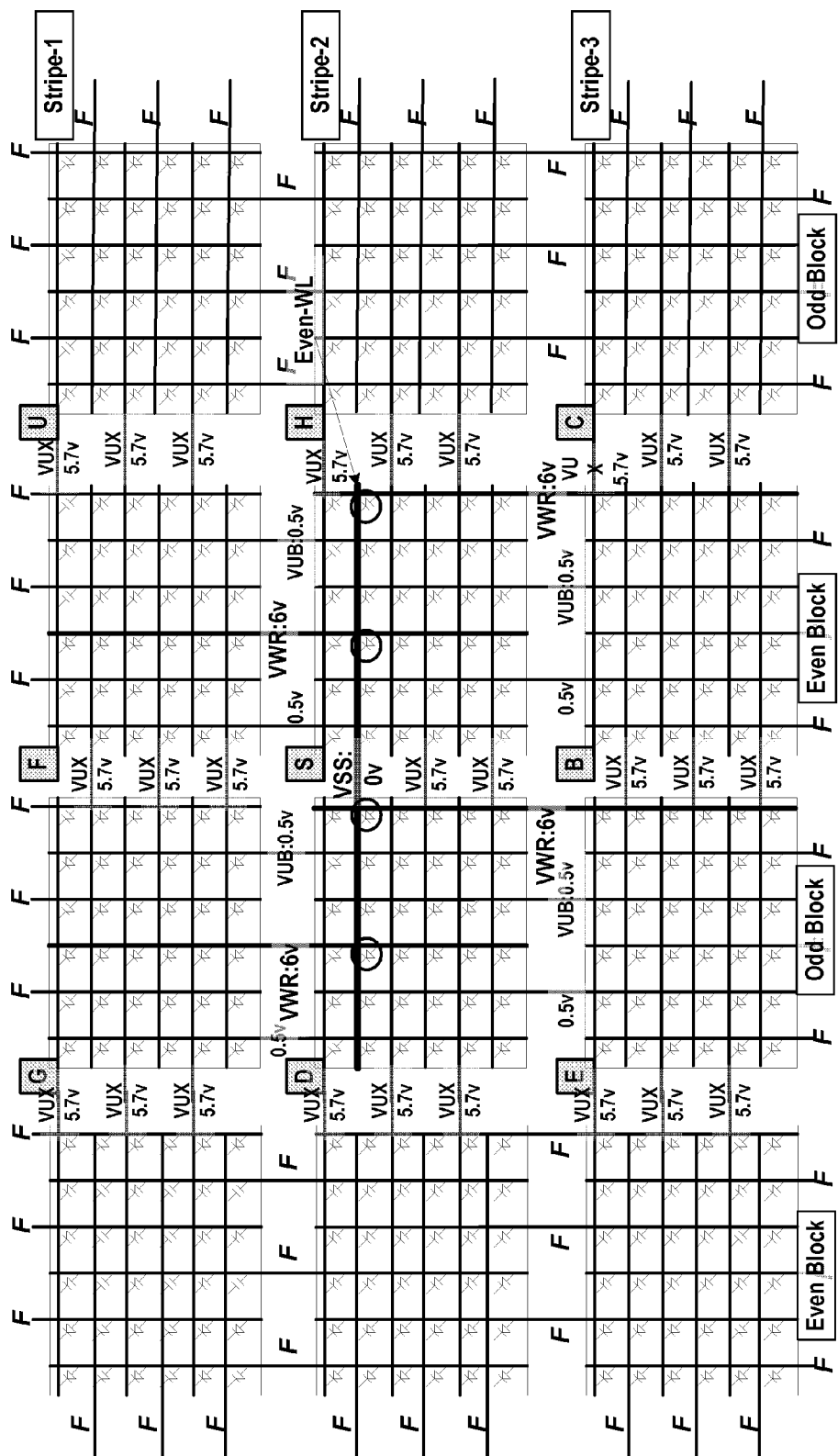
FIG. 12 depicts a portion of a memory array.

As discussed above, the non-volatile storage system includes a plurality of blocks of non-volatile storage elements. It is proposed that two adjacent blocks that share word lines and word line drivers be programmed concurrently. Such a scheme will reduce the number of reverse biased unselected/partially selected memory cells, in comparison to the number of memory cells selected for programming, that contribute to the power consumption of the system. Concurrently programming two adjacent blocks that share word line drivers will also allow more memory cells to be programmed concurrently as the total effective IR drop across all selected memory cells will be less limiting since the word line drivers can be located between the two blocks (e.g., in the middle of the memory cells being programmed). These benefits are explained by FIG. 12, which shows a portion of memory array 102, including twelve blocks. Nine of the twelve blocks are identified as block G, block F, block U, block D, block S, block H, block E, block B and block C.

Block S and block D are two adjacent blocks that are selected for programming. This means that system will concurrently program memory cells from block S and block D. As can be seen from FIG. 12, every other word line of block D (word lines are depicted as horizontal lines) run across and are connected to memory cells of block D and block S. The word lines drivers for those word lines are positioned between block D and block S.

Blocks G, F, U, H, E, B and C are not selected for programming. Blocks B, E, F and G a will have half of their bit lines floating, almost half of their bit lines connected to the unselected bit line voltage and some bit lines (depending on the number of memory cells that can be concurrently programmed) receiving a programming signal. Therefore, almost half of the memory cells of blocks B, E, F and G will be reverse biased. Thus, when programming two blocks, effectively two additional blocks worth of memory cells will be reverse biased. The reverse bias current can contribute to power consumption. However, the reverse bias current from the two effective blocks will have less of an impact than in prior systems which have more memory cells reverse biased.

Figure 13:
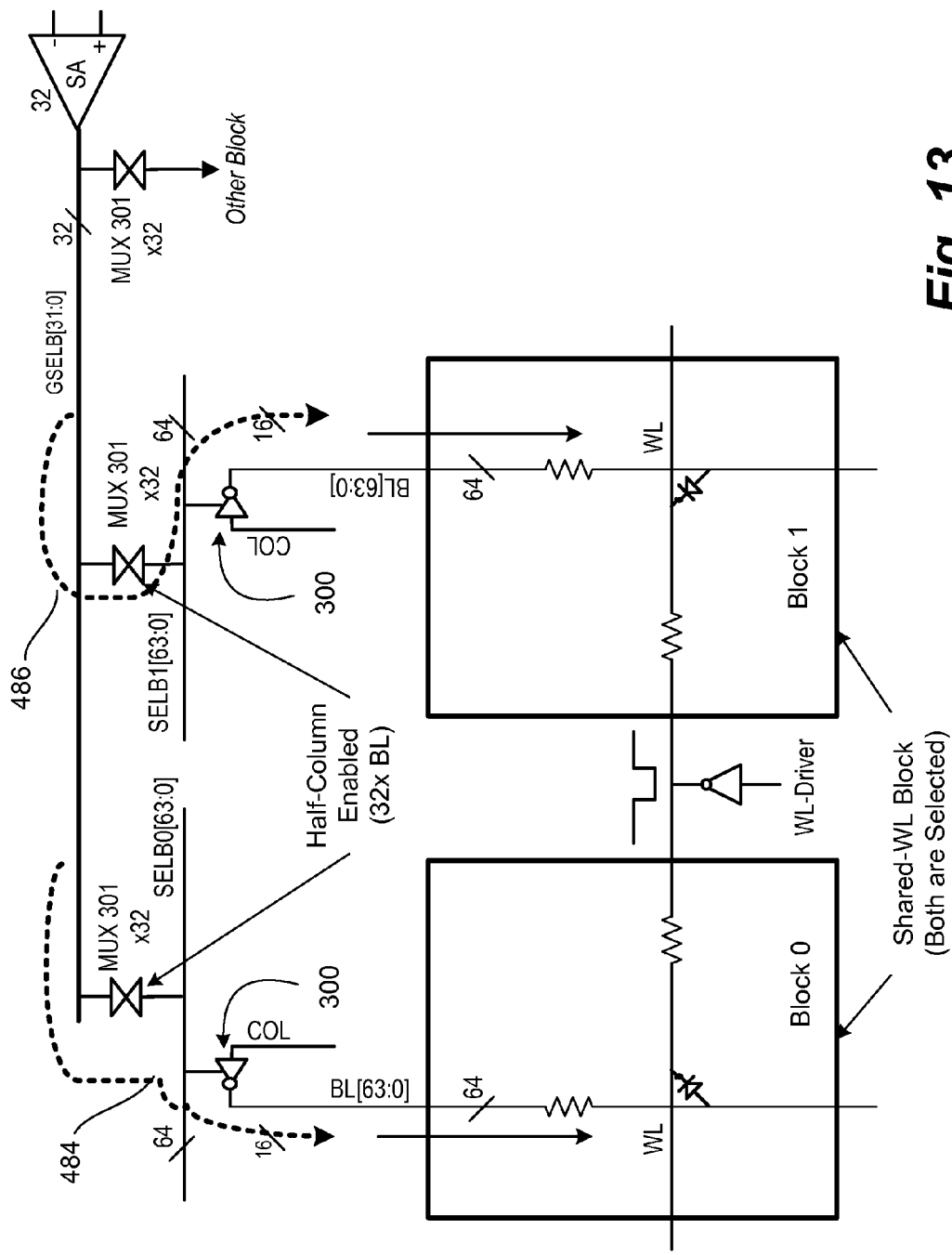
FIG. 13 depicts a portion of a memory array and supporting circuitry.

Block U, H and C are unselected. All bit lines in these blocks are floating. Although half of word lines of these blocks are biased to high VUX, there is still no leakage current to bit lines since the bit lines are floating FIG. 13 shows two adjacent blocks of memory cells for which memory cells of the two adjacent blocks (Block 0 and Block 1), connected to the same word line WL, are concurrently programmed according to a first embodiment. As can be seen, the word line driver (WL-Driver) connected to word line WL is positioned between the two adjacent blocks (Block 0 and Block 1). In each of the two blocks, the selected column of bit lines BL[63:0] are depicted. Each of the bit lines of the column are connected to the selected word line WL (on one or multiple levels of the monolithic three dimensional memory array). The selected bit lines for Block 0 are selectively connected to the local data lines SELB0[63:0] via sixty four selection circuits 300, as explained above. The local data lines SELB0[63:0] are connected to thirty two 2:1 multiplexer circuits 301 which selectively connect sixteen of the local data lines SELB0[63:0] to sixteen of the global data lines GSELB[31:0] by using two different MUX_EN[S] signals as described above and denoted in FIG. 13 by the label Half-Column Enabled.

The selected bit lines for Block 1 are selectively connected to the local data lines SELB1[63:0] via sixty four selection circuits 300, as explained above. The local data lines SELB1[63:0] are connected to thirty two 2:1 multiplexer circuits 301 which selectively connect sixteen of the local data lines SELB1[63:0] to sixteen of the global data lines GSELB[31:0]. In this embodiment, sixteen of the global data lines GSELB[31:0] are connected to sixteen of the SELB0[63:0] and a different sixteen of the global data lines GSELB[31:0] are connected to sixteen of the SELB1[63:0]. Thus, sixteen local data lines from both blocks are concurrently connected to the global data lines GSELB[31:0]. Since the global data lines are connected to the set of thirty two sense amplifiers SA (which is one example of a signal source), then sixteen selected memory cells of Block 0 are in communication (see dotted line 484) with sixteen sense amplifiers (SA) concurrently with sixteen selected memory cells of Block 1 being in communication (see dotted line 486) with sixteen sense amplifiers SA so that the thirty two memory cells (from the two adjacent blocks and connected to the same word line) can be concurrently programmed. Although thirty two memory cells can be concurrently programmed, some embodiments may concurrently program less than thirty two from the pair of adjacent blocks.

Note that various alternatives include each sense amplifier driving the same signal, each sense amplifier driving similar signals that are not exactly the same, all global data lines are connected to one sense amplifier, or the sense amplifiers drive different signals. Additionally, there can be one source for VUB, or multiple sources for VUB. VUB can be exactly the same from all sources, or VUB can vary slightly (or more than slightly) throughout the system. Additionally components other than 2:1 multiplexors can be used, such as 1:1 or 4:1 multiplexors. Additionally, the system can use different unselected bit line voltage throughout the system In one embodiment, when memory cells for two adjacent blocks are concurrently being programmed, the multiplexers 301 for the other blocks in the same Bay will be configured to connect the associated local data lines to VUB. The column select signal for a Bay or stripe may be connected to all blocks of the bay or stripe. Therefore, the memory cells in the selected columns for unselected block may receive VUB via p-channel transistor 370 of multiplexer 301 while memory cells in the unselected columns for unselected block may receive VUB via n-channel transistor 342 of selection circuit 300. Alternatively, memory cells in the selected columns for unselected block maybe floated.

Figure 14:
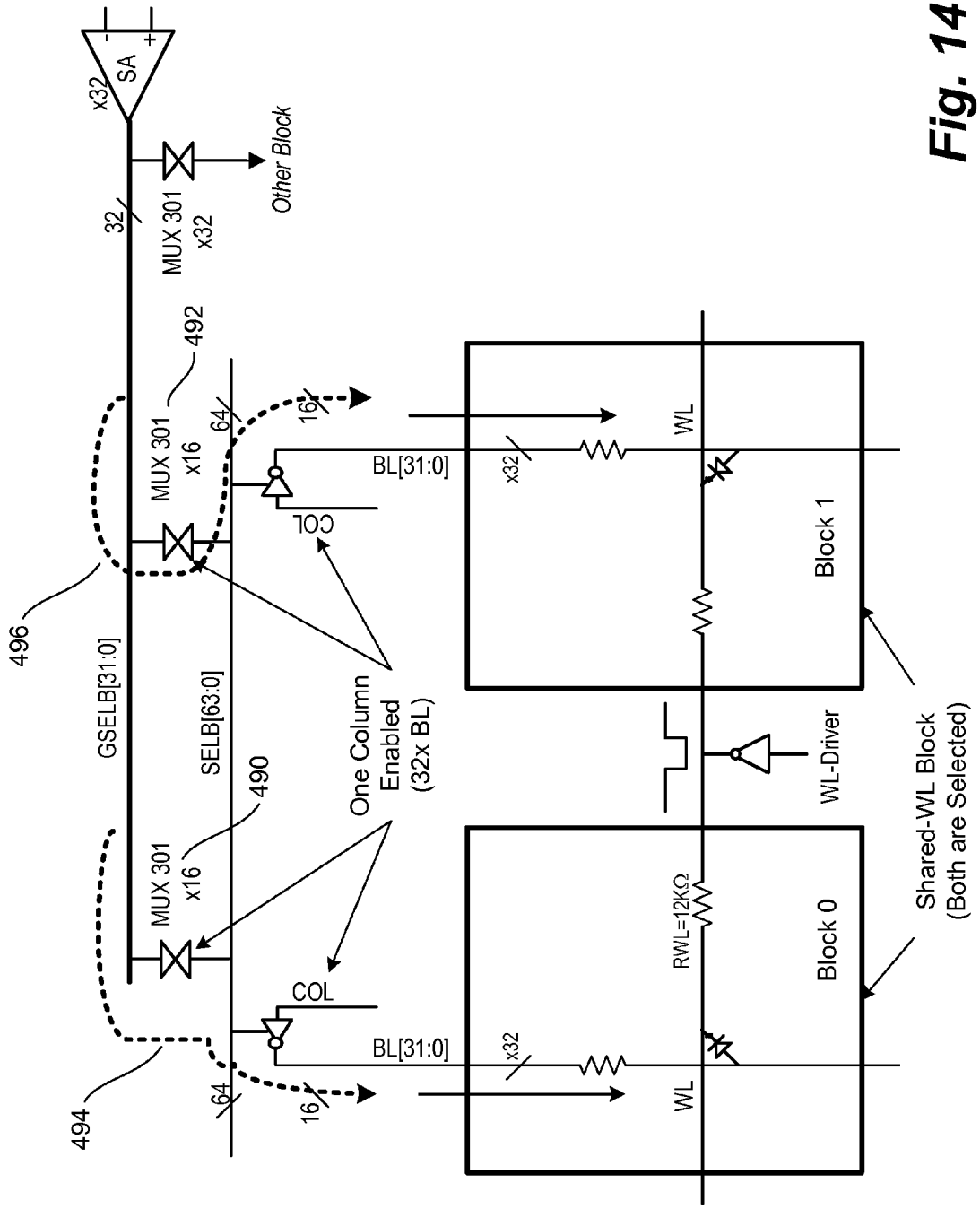
FIG. 14 depicts a portion of a memory array and supporting circuitry.

FIG. 14 shows two adjacent blocks of memory cells for which memory cells of the two adjacent blocks (Block 0 and Block 1), connected to the same word line WL, are concurrently programmed according to a second embodiment. As can be seen, the word line driver (WL-Driver) connected to word line WL is positioned between the two adjacent blocks (Block 0 and Block 1). In each of the two blocks, the selected column of bit lines BL[31:0] are depicted. Each of the bit lines of the column are connected to the selected word line WL (on one or multiple levels of the monolithic three dimensional memory array).

The selected bit lines BL[31:0] for Block 0 are selectively connected to thirty two of the local data lines SELB[63:0] via thirty two selection circuits 300. The selected bit lines BL[31:0] for Block 1 are selectively connected to a different thirty two of the local data lines SELB[63:0] via thirty two selection circuits 300. The local data lines SELB[63:0] are connected to thirty two 2:1 multiplexer circuits 301 which selectively connect thirty two of the local data lines SELB [63:0] to the global data lines GSELB[31:0]. In the embodiment of FIG. 14 the local data lines SELB[0:63] are positioned across the first block and the second block while in the embodiment of FIG. 13 the local data lines SELB0[0:63] are positioned across Block 0 only and the local data lines SELB1[0:63] are positioned across Block 1 only. The embodiment shown in FIG. 14 is useful to reduce the number of multiplexor circuits since the required multiplexors are shared over two blocks.

The thirty two 2:1 multiplexer circuits 301 are grouped into a first set (490) of sixteen 2:1 multiplexer circuits 301 underneath one of the blocks and a second set (492) of sixteen 2:1 multiplexer circuits 301 underneath the other block. In this manner, sixteen memory cells from Block 0 can be in communication (see dotted line 494) with the sense amplifiers via multiplexers 490 concurrently with sixteen memory cells from Block 1 being in communication (see dotted line 496) with the sense amplifiers via multiplexers 492 so that the thirty two memory cells (sixteen from each of the two adjacent blocks and connected to the same word line) can be concurrently programmed. Although thirty two memory cells can be concurrently programmed, some embodiments may concurrently program less than thirty two from the pair of adjacent blocks.

Although sixteen memory cells in one block and sixteen memory cells in an adjacent block are simultaneously programmed, in read mode thirty two memory cells in one block can be simultaneously read. In this embodiment, thirty two bit lines from one block are connected to thirty two local data lines SELB[31:0] by thirty two selection circuits 300 and further connected to thirty two global data lines GSELB[31:0] by the sixteen 2:1 multiplexor circuits 490 and the sixteen 2:1 multiplexor circuits 492. In other embodiments data is simultaneously read from two adjacent blocks using the paths shown by dotted lines in FIG. 13 and FIG. 14 for example.

In one embodiment, when memory cells for two adjacent blocks are concurrently being programmed, the multiplexers 301 for the other blocks in the same Bay will be configured to connect the associated local data lines to VUB. The column select signal for a Bay or stripe may be connected to all blocks of the bay or stripe. Therefore, the memory cells in the selected columns for unselected block may receive VUB via p-channel transistor 370 of multiplexer 301 while memory cells in the unselected columns for unselected block may receive VUB via n-channel transistor 342 of selection circuit 300. Alternatively, memory cells in the selected columns for unselected block maybe floated.

The structures depicted in FIGS. 13 and 14 are replicated many times in a memory array. For example, one embodiment of a memory array has many bays and many stripes, each of which implement the depicted structure. Although FIGS. 13 and 14 only show Block 0 and Block 1 of a bay, the sharing of word lines is accomplished by all (or most or many) of the set of adjacent blocks (see, e.g., FIG. 12). In one embodiment, only one set of adjacent blocks per bay can be selected for programming at the same time.

Figure 15:
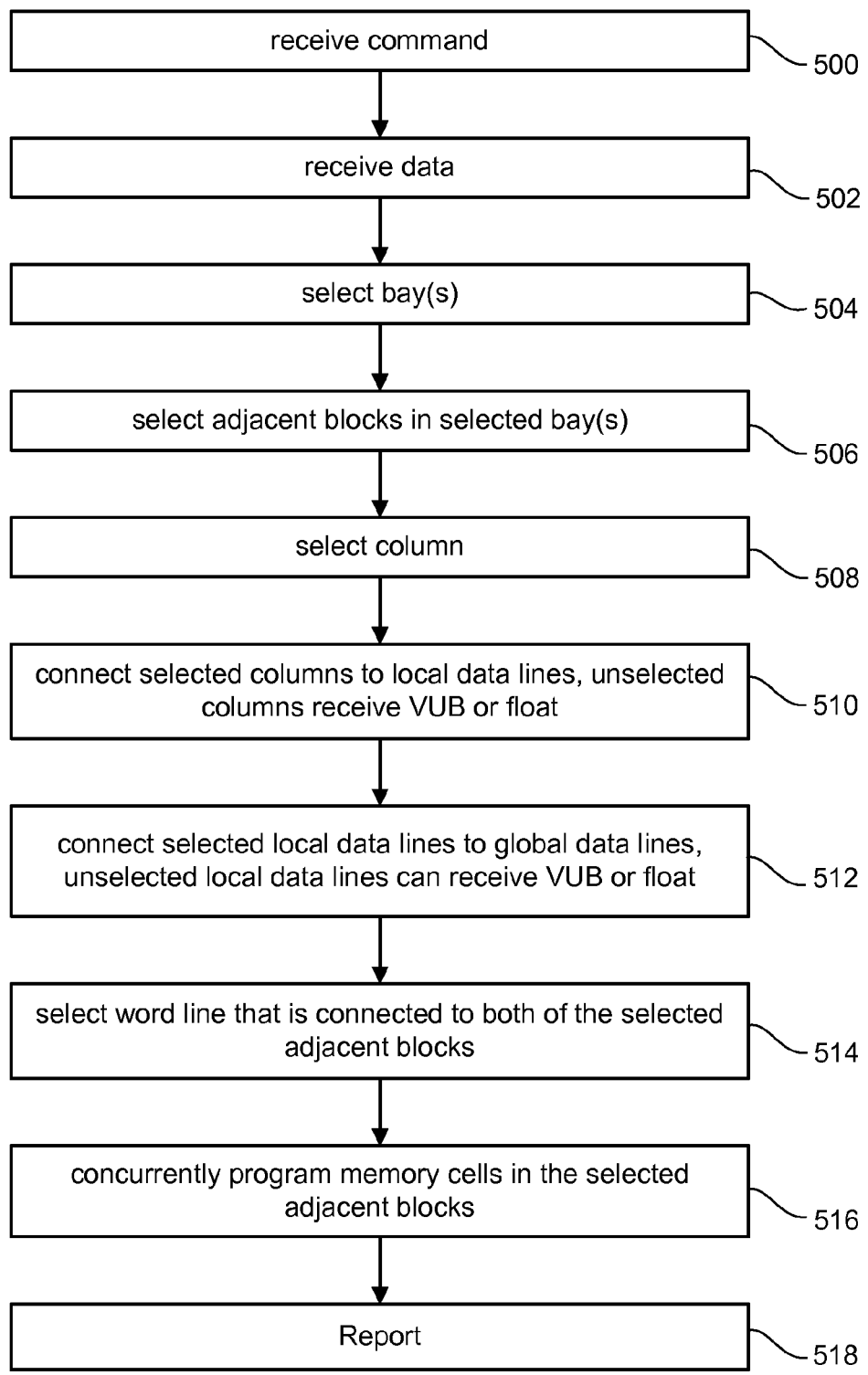
FIG. 15 is a flow chart describing one embodiment of a process for programming data.

FIG. 15 is a flow chart that describes a process that can be used by the structures described above to concurrently programming memory cells that are in adjacent blocks. In step 500 of FIG. 14, a programming command is received by system control logic 130. In step 502, data for programming is received by system control logic 130. In step 504, one or more bays are selected for performing the programming operation. In step 506, one or more sets of adjacent blocks are selected for performing the program operation. In step 508, one column of bit lines in the selected block(s) is selected. In step 510, the selected column(s) of bit lines is connected the respective set of local data lines via the selection circuits 300. Unselected bit lines may receive VUB via the respective selection circuits 300 or may float. In step 512, the selected local data lines are connected to the appropriate global data lines via multiplexers 301. Unselected local data lines can be connected to VUB via multiplexers 301, or may float. At this point, memory cells from adjacent blocks (and connected to the same word line) are concurrently enabled for programming and in communication with sense amplifiers via the bit lines, selection circuits 300, local data lines, multiplexers 301 and the global data lines. In step 516, the selected memory cells from adjacent blocks (and connected to the same word line) are concurrently programmed. Note that the term concurrently is used to indicate that the operations take place in a manner that overlaps in time, even if one of the operations starts or stops before the other. In step 518, system control logic 130 will report success or failure of the operation.

Figure 16:
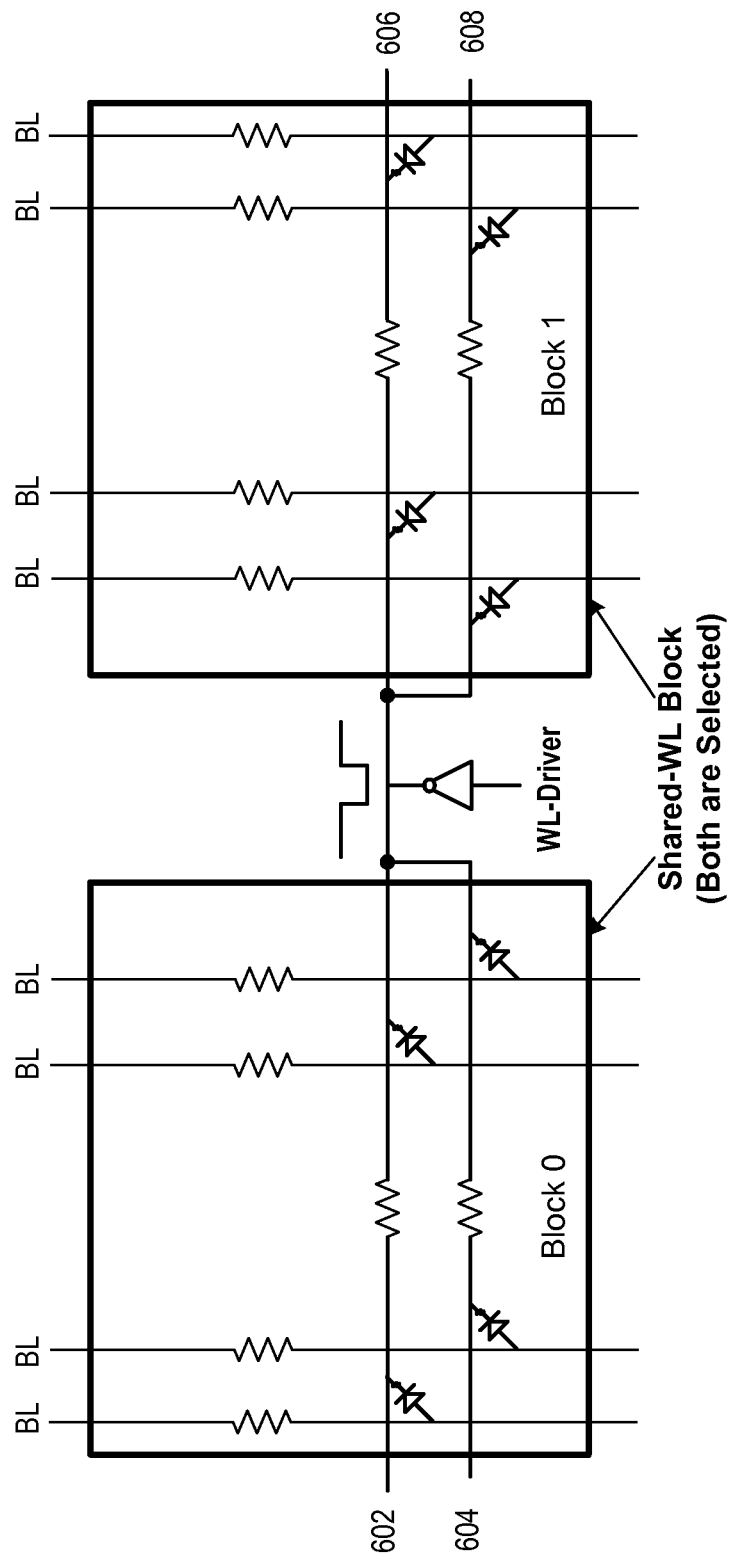
FIG. 16 depicts a portion of a memory array.

FIG. 16 shows two adjacent blocks of memory cells for which memory cells of the two adjacent blocks (Block 0 and Block 1), connected to the same word line, are concurrently programmed. The embodiment of FIG. 16 shows one word line connecting to memory cells in two adjacent blocks on two different levels of the monolithic three dimensional memory array. For example, the word line includes four segments 602, 604, 606, 608, all of which are connected to and driven by the same word line driver WL-Driver positioned between the two adjacent blocks (Block 0 and Block 1). The word line driver is also positioned on the substrate. Segment 602 of the word line is on a first level of the memory array and connected to memory cells of Block 0. Segment 604 of the word line is on a second level of the memory array and connected to memory cells of Block 0. Segment 606 of the word line is on the first level of the memory array and connected to memory cells of Block 1. Segment 608 of the word line is on the second level of the memory array and connected to memory cells of Block 1. The bit lines are arranged in columns and can be connected to sense amplifiers as discussed above with respect to FIGS. 13-15 so that memory cells of the two adjacent blocks, connected to the same word line, are concurrently programmed. In other embodiments, a word line can connect to more than two levels of a monolithic three dimensional memory array.

One embodiment includes, a plurality of blocks of non-volatile storage elements, a plurality of word lines connected to the blocks of non-volatile storage elements such that each word line is connected to adjacent blocks of non-volatile storage elements, a plurality of bit lines connected to the blocks of non-volatile storage elements, multiple sets of word lines drivers such that each set of word line drivers is positioned between two adjacent blocks for driving word lines connected to the two adjacent blocks, global data lines, local data lines in selective communication with the bit lines, one or more selection circuits that selectively connect the global data lines to selected local data lines and connect unselected local data lines to one or more unselected bit line signals, and control circuitry in communication with the one or more selection circuits and the global data lines. The control circuitry concurrently programs non-volatile storage elements of two adjacent blocks by applying programming signals on word lines connected to the two adjacent blocks using word line drivers and applying programming signals on appropriate bit lines via the global data lines and the one or more selection circuits.

In one embodiment, the word lines drivers are positioned on the surface of a substrate, while the memory cells of the monolithic three dimensional memory array are arranged above (and not on) the surface of the substrate. In this manner, the word line drivers are positioned on a lower level than the memory cells. Looking at FIG. 5B, the word lines drivers can be below R1, while the memory cells are above R1.

In one example, each block of non-volatile storage elements is connected to a different subset of the bit lines, a different subset of the local data lines and a different subset of the one or more selection circuits. The non-volatile storage device further comprises a plurality of second selection circuits selectively connecting respective local data lines for a respective block to bit lines for the respective block. The respective one or more selection circuits for the respective block provide for communication between a subset of the global data lines and a subset of connecting respective local data lines.

In one example, the plurality of second selection circuits connect unselected bit lines to one or more unselected bit line signals via devices having a first type of channel and the one or more first selection circuits connect unselected local data lines to one or more unselected bit line signals via devices having a second type of channel different than the first type of channel. For example, n-channel and p-channel transistors can be used.

In one example, each block of non-volatile storage elements is connected to a different subset of the bit lines. The non-volatile storage device further comprises a plurality of second selection circuits selectively connecting a first subset of the local data lines to selected bit lines of a first block of non-volatile storage elements and selectively connecting a second set of the local data lines to selected bit lines of a second block of non-volatile storage elements. The one or more first selection circuits include a first subset of the one or more first selection circuits connected to the first subset of local data lines and a first subset of the global data lines. The one or more first selection circuits include a second subset of the one or more first selection circuits connected to the second set of local data lines and a second subset of the global data lines. The first set of local data lines and the second set of local data lines are positioned across the first block and the second block.

In one example, the non-volatile storage elements comprise a monolithic three dimensional memory array, the word lines are each positioned on at least two levels of the monolithic three dimensional memory array, and the control circuitry concurrently programs non-volatile storage elements on multiple levels of the a block of non-volatile storage elements and non-volatile storage elements on multiple levels of a second block of non-volatile storage elements that are connected to a common set of word lines.

One example implementation includes a third block of non-volatile storage elements adjacent to the first block of non-volatile storage elements and not adjacent to the second block of non-volatile storage elements and a second set of word lines. Each word line of the second set is connected to non-volatile storage elements of the first block and non-volatile storage elements of the third block without being connected to non-volatile storage elements of the second block. When the control circuitry concurrently programs non-volatile storage elements of the first block and non-volatile storage elements of the second block that are connected to the first set of word lines the control circuitry does not concurrently program non-volatile storage elements of the third block and the control circuitry does not select or partially select non-volatile storage elements of the third block.

One embodiment includes a plurality of blocks of non-volatile storage elements, global data lines, local data lines in selective communication with the non-volatile storage elements, one or more first selection circuits that selectively connect the global data lines to selected local data lines and connect unselected local data lines to one or more unselected bit line signals, and control circuitry in communication with the one or more first selection circuits and the global data lines. The control circuitry concurrently programs non-volatile storage elements of two adjacent blocks of the non-volatile storage elements including controlling the one or more first selection circuits to enable the two adjacent blocks of the non-volatile storage elements to be in communication with the global data lines in order to apply one or more programming signals to the two adjacent blocks via the global data lines.

One embodiment includes selectively connecting selected non-volatile storage elements of two adjacent blocks of non-volatile storage elements to one or more signal sources and connecting unselected non-volatile storage elements to one or more unselected storage element signals using one or more selection circuits. Each of the one or more selection circuits can connect a respective signal source to one of two respective connected non-volatile storage elements and connect a respective unselected storage element signal to another of the two respective connected non-volatile storage elements. The method further comprises concurrently programming the two adjacent blocks of non-volatile storage elements while performing the selectively connecting.

One embodiment includes non-volatile storage elements including a first block of non-volatile storage elements and a second block of non-volatile storage elements adjacent to the first block of non-volatile storage elements, a first set of word lines such that each word line of the first set is connected to non-volatile storage elements of the first block and non-volatile storage elements of the second block, word line drivers positioned between the first block of non-volatile storage elements and the second block of non-volatile storage elements such that the word line drivers are connected to the first set of word lines, local data lines in selective communication with the non-volatile storage elements, global data lines, one or more first selection circuits that selectively connect the global data lines to selected local data lines and connect unselected local data lines to one or more unselected bit line signals, and control circuitry in communication with the one or more first selection circuits and the global data lines. The control circuitry concurrently programs non-volatile storage elements of the first block and non-volatile storage elements of the second block that are connected to the first set of word lines using the word line drivers and the global data lines via the one or more first selection circuits.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
   non-volatile storage elements including a first block of non-volatile storage elements and a second block of non-volatile storage elements adjacent to the first block of non-volatile storage elements, the non-volatile storage elements further include a third block of non-volatile storage elements adjacent to the first block of non-volatile storage elements and not adjacent to the second block of non-volatile storage elements;
   a first set of word lines, each word line of the first set is connected to non-volatile storage elements of the first block and non-volatile storage elements of the second block;
   a second set of word lines, each word line of the second set is connected to non-volatile storage elements of the first block and non-volatile storage elements of the third block without being connected to non-volatile storage elements of the second block;
   word line drivers positioned between the first block of non-volatile storage elements and the second block of non-volatile storage elements, the word line drivers are connected to the first set of word lines;
   local data lines in selective communication with the non-volatile storage elements;
   global data lines;
   one or more first selection circuits that selectively connect the global data lines to selected local data lines and connect unselected local data lines to one or more unselected bit line signals; and
   control circuitry in communication with the one or more first selection circuits and the global data lines, the control circuitry concurrently programs non-volatile storage elements of the first block and non-volatile storage elements of the second block that are connected to a common word line of the first set of word lines using the word line drivers and the global data lines via the one or more first selection circuits, when the control circuitry concurrently programs non-volatile storage elements of the first block and non-volatile storage elements of the second block that are connected to the common word line the control circuitry does not concurrently program non-volatile storage elements of the third block.

2. The non-volatile storage device of claim 1, further comprising:
   a first set of bit lines connected to the first block of non-volatile storage elements and a second set of bit lines connected to the second block of non-volatile storage elements, the local data lines include a first set of local data lines and a second set of local data lines; and
   a plurality of second selection circuits selectively connecting the first set of local data lines to selected bit lines of the first set of bit lines and selectively connecting the second set of local data lines to selected bit lines of the second set of bit lines, the one or more first selection circuits include a first subset of one or more first selection circuits selectively connecting the first set of local data lines to a first subset of the global data lines, the one or more first selection circuits include a second set of one or more first selection circuits selectively connecting the second set of local data lines to a second subset of the global data lines, the first subset of one or more first selection circuits are connected to the first subset of the global data lines and the second subset of the global data lines, the second subset of one or more first selection circuits are connected to the first subset of the global data lines and the second subset of the global data lines.

3. The non-volatile storage device of claim 2, wherein:
   the plurality of second selection circuits connect unselected bit lines of the first set of bit lines to one or more one or more unselected bit line signals via NMOS drivers;
   the plurality of second selection circuits connect unselected bit lines of the second set of bit lines to one or more one or more unselected bit line signals via NMOS drivers; and
   the one or more first selection circuits connect unselected local data lines to one or more unselected bit line signals via PMOS drivers.

4. The non-volatile storage device of claim 2, wherein:
   the plurality of second selection circuits connect unselected bit lines of the first set of bit lines to one or more one or more unselected bit line signals via devices having a first type of channel;
   the plurality of second selection circuits connect unselected bit lines of the second set of bit lines to one or more one or more unselected bit line signals via devices having the first type of channel; and
   the one or more first selection circuits connect unselected local data lines to one or more unselected bit line signals via devices having a second type of channel different than the first type of channel.

5. The non-volatile storage device of claim 1, further comprising:
   a first set of bit lines connected to the first block of non-volatile storage elements and a second set of bit lines connected to the second block of non-volatile storage elements, the local data lines are positioned across the first block and the second block; and
   a plurality of second selection circuits selectively connecting a first subset of the local data lines to selected bit lines of the first set of bit lines and selectively connecting a second set of the local data lines to selected bit lines of the second set of bit lines, the one or more first selection circuits include a first subset of the one or more first selection circuits connected to the first subset of local data lines and a first subset of the global data lines, the one or more first selection circuits include a second subset of the one or more first selection circuits connected to the second set of local data lines and a second subset of the global data lines, the first subset of the one or more first selection circuits are not connected to the second subset of the global data lines, the second subset of the one or more first selection circuits are not connected to the first subset of the global data lines.

6. The non-volatile storage device of claim 1, wherein:
   each of the one or more first selection circuits includes a connection to one global data line, two local data lines and an unselected bit line signal so that a respective first selection circuit can selectively connect one of the respective local data lines to the respective global data line and the other local data line to the unselected bit line signal.

7. The non-volatile storage device of claim 1, wherein:
   the non-volatile storage elements comprise a monolithic three dimensional memory array;
   the word lines of the first set of word lines are each positioned on at least two levels of the monolithic three dimensional memory array; and
   the control circuitry concurrently programs non-volatile storage elements on multiple levels of the first block and non-volatile storage elements on multiple levels of the second block that are connected to the first set of word lines.

8. A non-volatile storage device, comprising:
a plurality of blocks of non-volatile storage elements including a first block of non-volatile storage elements, a second block of non-volatile storage elements adjacent the first block and a third block of non-volatile storage elements that is adjacent to the first block but not adjacent to the second block;
a plurality of word lines connected to the blocks of non-volatile storage elements, each word line is connected to adjacent blocks of non-volatile storage elements;
a plurality of bit lines connected to the blocks of non-volatile storage elements;
multiple sets of word lines drivers, each set of word line drivers is positioned between two adjacent blocks for driving word lines connected to the two adjacent blocks;
global data lines;
local data lines in selective communication with the bit lines;
one or more selection circuits that selectively connect the global data lines to selected local data lines and connect unselected local data lines to one or more unselected bit line signals; and
control circuitry in communication with the one or more selection circuits and the global data lines, the control circuitry concurrently programs non-volatile storage elements of two adjacent blocks by applying programming signals on word lines connected to the two adjacent blocks using word line drivers and applying programming signals on appropriate bit lines via the global data lines and the one or more selection circuits, when the control circuitry concurrently programs non-volatile storage elements of the first block and non-volatile storage elements of the second block that are connected to a common word line the control circuitry does not concurrently program non-volatile storage elements of the third block.

9. The non-volatile storage device of claim 8, wherein each block of non-volatile storage elements is connected to a different subset of the bit lines, a different subset of the local data lines and a different subset of the one or more selection circuits, the non-volatile storage device further comprising:
a plurality of second selection circuits selectively connecting respective local data lines for a respective block to bit lines for the respective block, the respective one or more selection circuits for the respective block provide for communication between a subset of the global data lines and a subset of connected respective local data lines.

10. The non-volatile storage device of claim 9, wherein:
the plurality of second selection circuits connect unselected bit lines of to one or more unselected bit line signals via devices having a first type of channel; and
the one or more first selection circuits connect unselected local data lines to one or more unselected bit line signals via devices having a second type of channel different than the first type of channel.

11. The non-volatile storage device of claim 8, wherein each block of non-volatile storage elements is connected to a different subset of the bit lines, the non-volatile storage device further comprising:
a plurality of second selection circuits selectively connecting a first subset of the local data lines to selected bit lines of a first block of non-volatile storage elements and selectively connecting a second set of the local data lines to selected bit lines of a second block of non-volatile storage elements, the one or more first selection circuits include a first subset of the one or more first selection circuits connected to the first subset of local data lines and a first subset of the global data lines, the one or more first selection circuits include a second subset of the one or more first selection circuits connected to the second set of local data lines and a second subset of the global data lines, the first set of local data lines and the second set of local data lines are positioned across the first block and the second block.

12. The non-volatile storage device of claim 8, wherein:
the non-volatile storage elements comprise a monolithic three dimensional memory array;
the word lines are each positioned on at least two levels of the monolithic three dimensional memory array; and
the control circuitry concurrently programs non-volatile storage elements on multiple levels of the two adjacent blocks of non-volatile storage elements that are connected to a common word line.

13. A non-volatile storage device, comprising:
a plurality of blocks of non-volatile storage elements including a first block of non-volatile storage elements, a second block of non-volatile storage elements adjacent to the first block and a third block of non-volatile storage elements that is adjacent the first block but not adjacent to the second block;
global data lines;
local data lines in selective communication with the non-volatile storage elements;
one or more first selection circuits that selectively connect the global data lines to selected local data lines and connect unselected local data lines to one or more unselected bit line signals; and
control circuitry in communication with the one or more first selection circuits and the global data lines, the control circuitry concurrently programs non-volatile storage elements of the first block and non-volatile storage elements of the second block including controlling the one or more first selection circuits to enable the first and second blocks of the non-volatile storage elements to be in communication with the global data lines in order to apply one or more programming signals to the two adjacent blocks via the global data line, when the control circuitry concurrently programs non-volatile storage elements of the first block and non-volatile storage elements of the second the control circuitry does not concurrently program non-volatile storage elements of the third block.

14. The non-volatile storage device of claim 13, further comprising:
a first set of bit lines connected to the first block of non-volatile storage elements and the second set of bit lines connected to a second block of non-volatile storage elements, the local data lines include a first set of local data lines associated with the first block and a second set of local data lines associated with the second block, the first block is adjacent the second block; and
a plurality of second selection circuits selectively connecting the first set of local data lines to selected bit lines of the first set of bit lines and selectively connecting the second set of local data lines to selected bit lines of the second set of bit lines, the one or more first selection circuits include a first subset of one or more first selection circuits selectively connecting the first set of local data lines to a first subset of the global data lines, the one or more first selection circuits include a second set of one or more first selection circuits selectively connecting the second set of local data lines to a second subset of the global data lines, the first subset of one or more first selection circuits are connected to the first subset of the global data lines and the second subset of the global data lines, the second subset of one or more first selection circuits are connected to the first subset of the global data lines and the second subset of the global data lines.

15. The non-volatile storage device of claim 14, wherein:
the plurality of second selection circuits connect unselected bit lines of the first set of bit lines to one or more one or more unselected bit line signals via devices having a first type of channel;
the plurality of second selection circuits connect unselected bit lines of the second set of bit lines to one or more one or more unselected bit line signals via devices having the first type of channel; and
the one or more first selection circuits connect unselected local data lines to one or more unselected bit line signals via devices having a second type of channel that is different than the first type of channel.

16. The non-volatile storage device of claim 13, further comprising:
a first set of bit lines connected to the first block of non-volatile storage elements and a second set of bit lines connected to the second block of non-volatile storage elements, the local data lines are positioned across the first block and the second block, the first block is adjacent the second block; and
a plurality of second selection circuits selectively connecting a first subset of the local data lines to selected bit lines of the first set of bit lines and selectively connecting a second set of the local data lines to selected bit lines of the second set of bit lines, the one or more first selection circuits include a first subset of the one or more first selection circuits connected to the first subset of local data lines and a first subset of the global data lines, the one or more first selection circuits include a second subset of the one or more first selection circuits connected to the second set of local data lines and a second subset of the global data lines.

17. The non-volatile storage device of claim 13, further comprising:
word lines connected to the non-volatile storage elements, the non-volatile storage elements comprise a monolithic three dimensional memory array, the word lines are each positioned on at least two levels of the monolithic three dimensional memory array, and the control circuitry concurrently programs non-volatile storage elements on multiple levels of blocks.

18. The non-volatile storage device of claim 13, wherein:
the non-volatile storage elements each include a reversible resistance-switching element.

19. A non-volatile storage device, comprising:
non-volatile storage elements including a first block of non-volatile storage elements and a second block of non-volatile storage elements adjacent to the first block of non-volatile storage elements, the non-volatile storage elements further include a third block of non-volatile storage elements adjacent to the first block of non-volatile storage elements and not adjacent to the second block of non-volatile storage elements;
a first set of word lines, each word line of the first set is connected to non-volatile storage elements of the first block and non-volatile storage elements of the second block;
a second set of word lines, each word line of the second set is connected to non-volatile storage elements of the first block and non-volatile storage elements of the third block without being connected to non-volatile storage elements of the second block;
a first set of word line drivers positioned between the first block of non-volatile storage elements and the second block of non-volatile storage elements, the first set of word line drivers are connected to the first set of word lines;
a second set of word line drivers positioned between the first block of non-volatile storage elements and the third block of non-volatile storage elements, the second set of word line drivers are connected to the second set of word lines; and
control circuitry that concurrently programs non-volatile storage elements of the first block and non-volatile storage elements of the second block that are connected to a common word line of the first set of word lines, when the control circuitry concurrently programs non-volatile storage elements of the first block and non-volatile storage elements of the second block that are connected to the common word line the control circuitry does not concurrently program non-volatile storage elements of the third block.

20. A non-volatile storage device, comprising:
non-volatile storage elements including a first block of non-volatile storage elements and a second block of non-volatile storage elements adjacent to the first block of non-volatile storage elements, the non-volatile storage elements include a third block of non-volatile storage elements adjacent to the first block of non-volatile storage elements and not adjacent to the second block of non-volatile storage elements;
a first set of word lines, each word line of the first set is connected to non-volatile storage elements of the first block and non-volatile storage elements of the second block;
a second set of word lines, each word line of the second set is connected to non-volatile storage elements of the first block and non-volatile storage elements of the third block without being connected to non-volatile storage elements of the second block;
word line drivers positioned between the first block of non-volatile storage elements and the second block of non-volatile storage elements, the word line drivers are connected to the first set of word lines;
local data lines in selective communication with the non-volatile storage elements;
global data lines;
one or more first selection circuits that selectively connect the global data lines to selected local data lines and connect unselected local data lines to one or more unselected bit line signals; and
control circuitry in communication with the one or more first selection circuits and the global data lines, the control circuitry concurrently programs non-volatile storage elements of the first block and non-volatile storage elements of the second block that are connected to a common word line of the first set of word lines using the word line drivers and the global data lines via the one or more first selection circuits, when the control circuitry concurrently programs non-volatile storage elements of the first block and non-volatile storage elements of the second block that are connected to the common word line the control circuitry does not select or partially select non-volatile storage elements of the third block.

* * * * *